(12) United States Patent
Ruitenburg

(10) Patent No.: US 7,522,903 B2
(45) Date of Patent: Apr. 21, 2009

(54) THREE-PHASE MIXER-SYSTEM

(75) Inventor: Leonardus Joseph Michael Ruitenburg, Eindhoven (NL)

(73) Assignee: NXP B.V., Eindhoven (NL)

( * ) Notice: Subject to any disclaimer, the term of this patent is extended or adjusted under 35 U.S.C. 154(b) by 597 days.

(21) Appl. No.: 10/543,280

(22) PCT Filed: Dec. 18, 2003

(86) PCT No.: PCT/IB03/06097

§ 371 (c)(1),
(2), (4) Date: Jul. 25, 2005

(87) PCT Pub. No.: WO2004/068699

PCT Pub. Date: Aug. 12, 2004

(65) Prior Publication Data

US 2006/0141970 A1 Jun. 29, 2006

(30) Foreign Application Priority Data

Jan. 28, 2003 (EP) .................. 03100175

(51) Int. Cl.
*H04B 1/26* (2006.01)
(52) U.S. Cl. .......... 455/326; 455/293; 455/356
(58) Field of Classification Search ........... 455/326
See application file for complete search history.

(56) References Cited

U.S. PATENT DOCUMENTS

| | | | |
|---|---|---|---|
| 5,708,383 A * | 1/1998 | Lee | 327/356 |
| 6,194,947 B1 | 2/2001 | Lee | |
| 6,385,442 B1 | 5/2002 | Vu | |
| 2006/0063504 A1 * | 3/2006 | Bergervoet et al. | 455/293 |

* cited by examiner

*Primary Examiner*—Yuwen Pan
*Assistant Examiner*—Ajibola Akinyemi
(74) *Attorney, Agent, or Firm*—Aaron Waxler

(57) ABSTRACT

Three-phase mixer-systems comprising at least three groups of mixers (1-4,5-8,9-12,30) for frequency translating signals are (basic idea) provided with balancing means (13-21,31) for suppressing certain mixing products with harmonics of the oscillator signal resulting from unbalance (insight). Said three groups of mixers (1-4,5-8,9-12) each comprise a group of switching transistors (1-3,5-7,9-11) and an amplifying transistor (4,8,12) coupled to said group of switching transistors (1-3,5-7,9-11) and are balanced by said balancing means (13-21) comprising per group of mixers (1-4,5-8,9-12) and per at least one switching transistor of said group of switching transistors (1-3,5-7,9-11) a further switching transistor (13-21). Said three groups of mixers (30) can also be balanced by a further group of mixers (31), with said group of mixers (30) receiving second signals (R,S,T) and first signals (r RF,s RF,t RF), with said further group of mixers (31) receiving inverted second signals (−R,−S,−T) and (inverted combinations or not of) said first signals (r RF,s RF,t RF), and with outputs of said group of mixers (30) and of said further group of mixers (31) being coupled to each other for generating combinations (sums or differences) of output signals.

8 Claims, 3 Drawing Sheets

THREE-PHASE MIXER-SYSTEM

Figure 1:
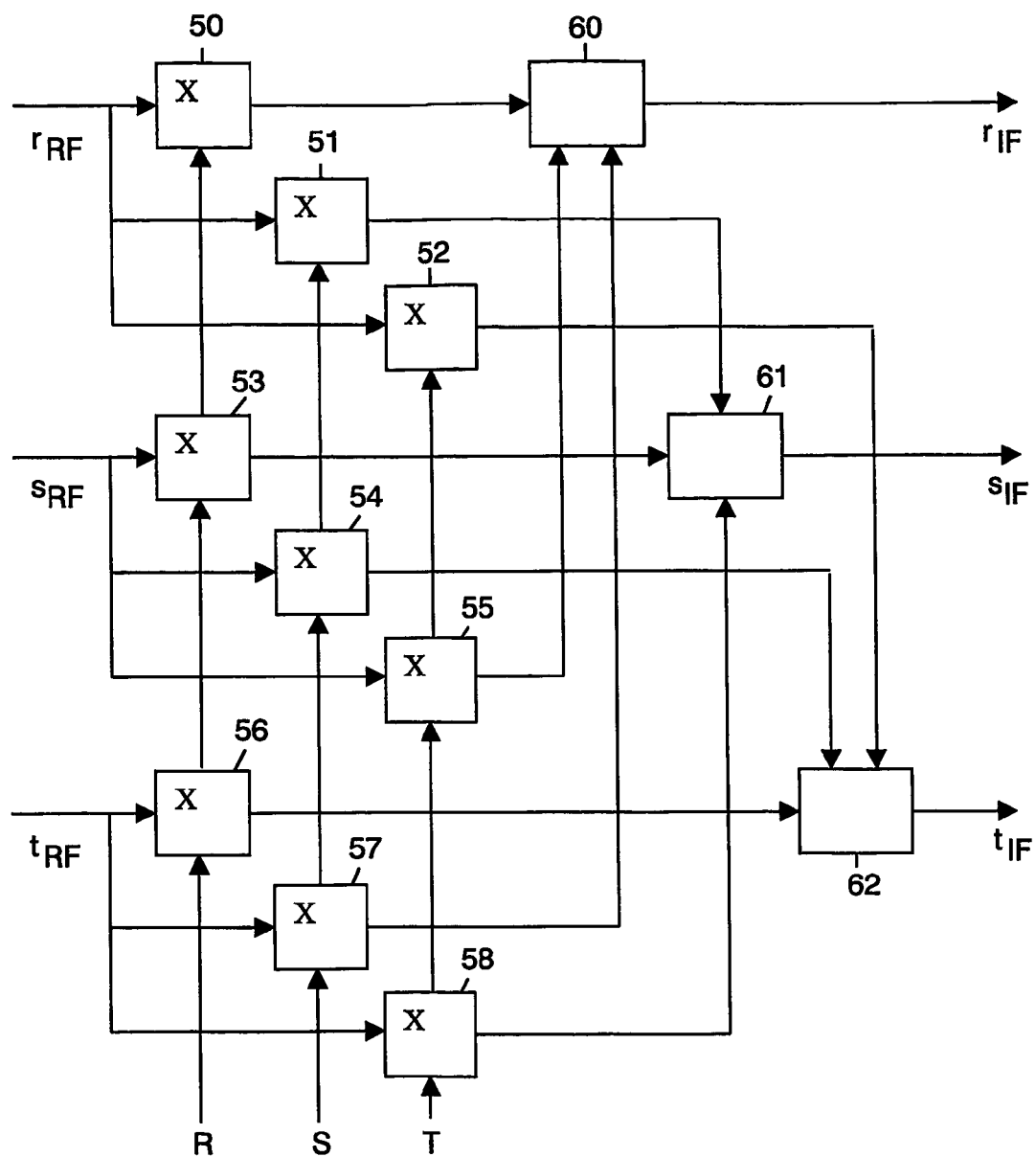

The invention relates to a three-phase mixer-system comprising at least three groups of mixers for frequency translating signals.

The invention further relates to an apparatus comprising a three-phase mixer-system comprising at least three groups of mixers for frequency translating signals, and also relates to a method for frequency translating signals via three-phase mixing.

Such a three-phase mixer-system for example either performs an up-conversion of frequencies, in which case said apparatus for example forms part of a transmitter, or performs a down-conversion, in which case said apparatus for example forms part of a receiver. Said apparatus may be for example a telecommunication apparatus, like for example a mobile phone or a modem or a transceiver etc., or may be for example an audio receiver, like a radio etc., or an audio/video receiver, like for example a television etc.

A prior art three-phase mixer-system is disclosed in a non-prepublished European patent application filed by the same applicant and referenced by EP 02080247.6.

This prior art three-phase mixer-system requires, inter alia, the apparatus to be provided with polyphase filters and/or bandpass filters for preventing and/or suppressing mixing products (of for example (harmonics of) an oscillator signal) in the output signals of said three-phase mixer-system.

It is an object of the invention, inter alia, of providing a three-phase mixer-system as defined above requiring less polyphase filtering and/or bandpass filtering.

Further objects of the invention are, inter alia, providing an apparatus as defined above comprising less complex and/or less expensive filters, and providing a method as defined above requiring less polyphase filtering and/or bandpass filtering.

The three-phase mixer-system according to the invention comprises at least three groups of mixers for frequency translating signals, wherein said three-phase mixer-system comprises balancing means for balancing at least a part of said three-phase mixer-system.

By introducing said balancing means, at least a part of said three-phase mixer-system is more balanced, which will result in the output signals of the three-phase mixer-system comprising less unwanted mixing products.

Then, with less unwanted mixing products being present in said output signals, at least less severe (less complex and/or less power dissipating and/or less expensive) filtering and/or for certain harmonics no filtering at all will be required.

A first embodiment of the three-phase mixer-system according to the invention is defined by claim 1.

Said first signals for example comprise three signals received or to be transmitted and each being shifted in phase 120 degrees with respect to the other two. Said second signals for example comprise three oscillator signals and each being shifted in phase 120 degrees with respect to the other two. By supplying inverted (first or second) signals to the balancing means, in the output signals the even harmonics have disappeared, the third harmonic appears in the form of a common mode which can be easily suppressed by common mode suppression, the fifth harmonic appears in the form of a negative frequency which can be easily suppressed by polyphase filtering, and the seventh harmonic appears in the form of a positive frequency which can be easily suppressed by conventional filtering.

A second embodiment of the three-phase mixer-system according to the invention is defined by claim 3.

By creating each group of mixers through a group of switching transistors controlled via said second signals (at their control electrodes like for example basis or gate) and through at least one amplifying transistor coupled to at least said group of switching transistors, with said balancing means comprising per group of mixers and per at least one switching transistor of said group of switching transistors at least one further switching transistor, which further switching transistors are controlled via inverted second signals (at their control electrodes like for example basis or gate), compared to said prior art three-phase mixer-system having 33.3% duty cycles, the three-phase mixer-system according to the invention uses six-phase second signals and has 50% duty cycles and is additionally balanced (a three-phase signal itself is already balanced, but the 50% duty cycles avoid the generation of mixing products with even harmonics of the oscillator signal in the switching transistors). Additional advantages of 50% duty cycles are a highest possible mixer efficiency and an improved noise figure.

A third embodiment of the three-phase mixer-system according to the invention is defined by claim 4.

This third embodiment is a low complex, low power, low cost and easy-to-integrate embodiment, with said amplifying transistors being controlled via said first signals (at their control electrodes like for example basis or gate), and with first main electrodes for example being emitters or sources and with second main electrodes for example being collectors or drains. Preferably, each at least one switching transistor in said group of switching transistors comprises two parallel switching transistors, each at least one further switching transistor comprises two switching transistors of which the control electrodes are coupled to each other and of which the first main electrodes are coupled to each other and of which the second main electrodes are coupled to different other outputs, and each at least one amplifying transistor comprises three amplifying transistors of which the control electrodes are coupled to each other and of which the first main electrodes are coupled to each other etc.

A fourth embodiment of the three-phase mixer-system according to the invention is defined by claim 5.

By creating said balancing means through said further groups of mixers, both groups of mixers together make the three-phase mixer-system well balanced.

A fifth embodiment of the three-phase mixer-system according to the invention is defined by claim 6.

In case of said balancing means receiving inverted combinations of first signals, each combination of a pair of first signals for example comprises a sum of two first signals. In case of said balancing means receiving said first signals, no combinations need to be made.

A sixth embodiment of the three-phase mixer-system according to the invention is defined by claim 7.

This sixth embodiment is a low complex, low power, low cost and easy-to-integrate embodiment, with said three-phase mixer-system for example further comprising combiners like for example adders for adding pairs of output signals and for generating combinations like for example sums of these pairs of output signals (in case of said balancing means receiving inverted combinations of first signals) or further comprising combiners like for example subtracters for subtracting pairs of output signals and for generating combinations like for example differences of these pairs of output signals (in case of said balancing means receiving said first signals). While using said first group of mixers receiving three out of six (six-phase) second signals and using said further group of mixers receiving the other three out of said six (six-phase)

second signals, said even harmonics caused by said 33.3% duty cycles will be cancelled by said adding or subtracting of said output signals.

Preferably the (first) balancing means (in the form of said further transistors) and the (second) balancing means (in the form of said further group of mixers) are combined for getting a most optimal seventh embodiment.

The apparatus according to the invention comprises a three-phase mixer-system comprising at least three groups of mixers for frequency translating signals, wherein said three-phase mixer-system comprises balancing means for balancing at least a part of said three-phase mixer-system, with said apparatus comprising at least one polyphase filter coupled to first or second inputs of said three-phase mixer-system.

Said at least one polyphase filter will filter a first input signal and/or a second input signal and convert this input signal into three sub-signals with 120 degrees phase differences between each pair of sub-signals to be supplied to the inputs of the three-phase mixer-system. Said first input signal may comprise an audio/video/data signal and said second input signal may comprise an oscillation signal, or vice versa.

Said at least one further filter coupled to outputs of said three-phase mixer-system may comprise one or more further polyphase filters for converting three output signals each being shifted in phase 120 degrees with respect to the other two into one output signal and (assuming the wanted signal has a positive frequency) for filtering unwanted negative frequency mixing products (this holds for example for the mixing product with the fifth harmonic of the second signal), and/or may comprise one or more bandpass filters or lowpass filters for filtering positive harmonics (like for example the seventh harmonic).

Embodiments of the apparatus according to the invention and of the method according to the invention correspond with the embodiments of the three-phase mixer-system according to the invention.

The invention is based upon an insight, inter alia, that unbalance will cause mixing products with harmonics of the oscillator signal, and is based upon a basic idea, inter alia, that said unbalance can be reduced or even avoided by introducing balancing means.

The invention solves the problem, inter alia, of providing a three-phase mixer-system requiring less polyphase filtering and/or bandpass filtering, and is advantageous, inter alia, in that less complex and/or less expensive and/or less power consuming filters are needed, with the three-phase mixer-system being low cost and still having low power consumption and requiring little and/or less chip surface.

About the insight, the following. For the product of one of the poly-phase input signal components (first signals) with one of the poly-phase (oscillator) sine-wave signal components (second signals), at the mixer output the output signal will become a poly-phase component with sum-frequency and sum-phase of both. With a three-phase input signal (first signals) and a three-phase oscillator signal (second signals), nine mixing products will follow with only three possible different phase values (neglecting multiples of 360 degrees), which can thus be combined to a three-phase signal again. At the oscillator terminals (usually base or gate connections) oscillator harmonics will be significantly present, each of them having a frequency plus a phase equal to the fundamental oscillator frequency plus phase both multiplied with the harmonic number. As a consequence the n-th harmonic of an n-phase oscillator will have the same phase at all oscillator terminals, which means common mode. For this n-th harmonic common mode rejection in the mixer as well as canceling at a summation point (with the canceling being based on three-phase balance) will result in a very low mixer gain at this frequency. By duplication of the mixer structure, but applying opposite sign oscillator signals, cancellation of mixing products with the second harmonic of the oscillator signals can similarly be canceled by subtracting both corresponding mixer output signals. This result is obtained, since the second harmonic of opposite sign oscillator signals are identical and so canceling by two-phase (or differential signal) balance is obtained.

These and other aspects of the invention will be apparent from and elucidated with reference to the embodiments(s) described hereinafter.

Figure 2:
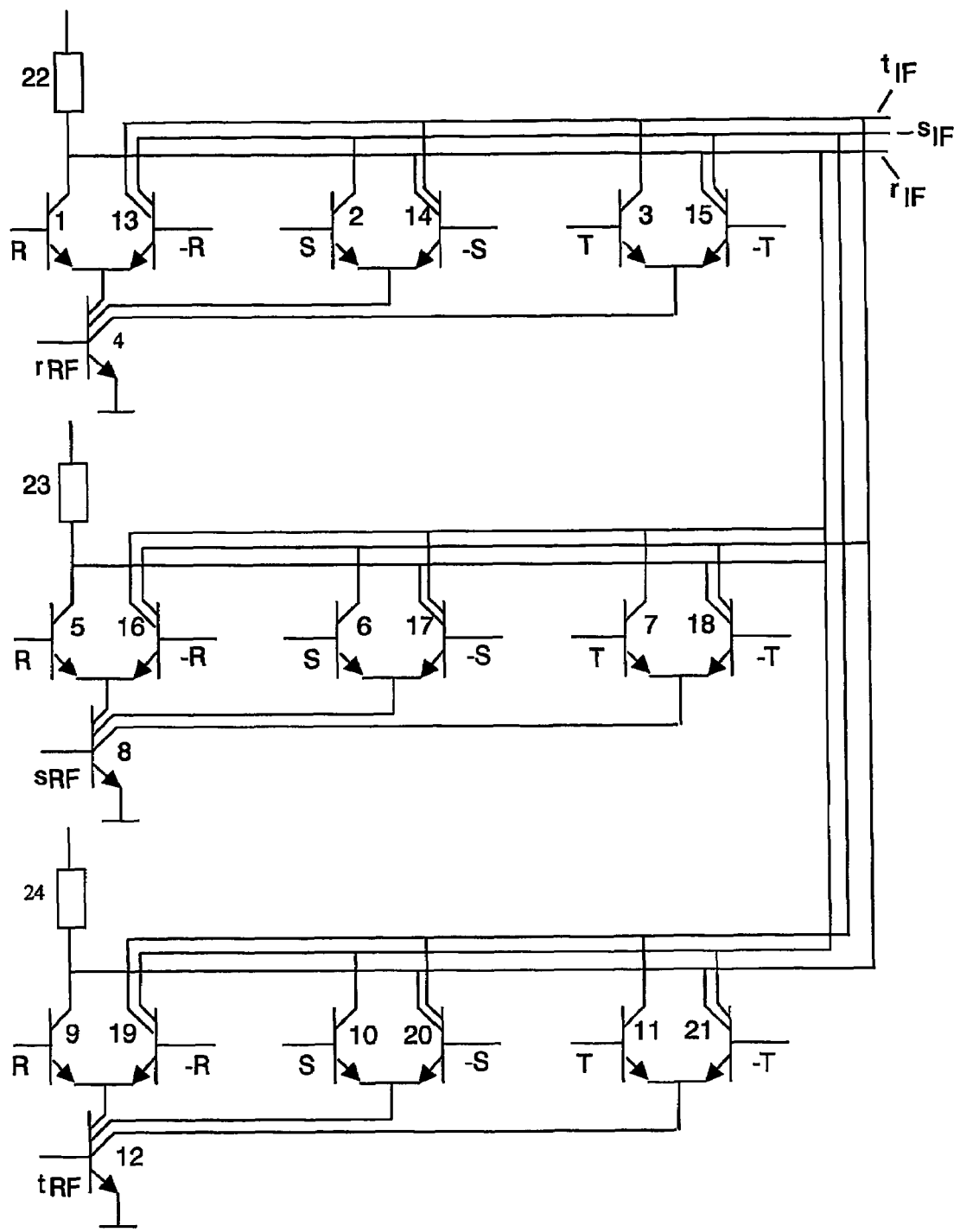
Figure 3:
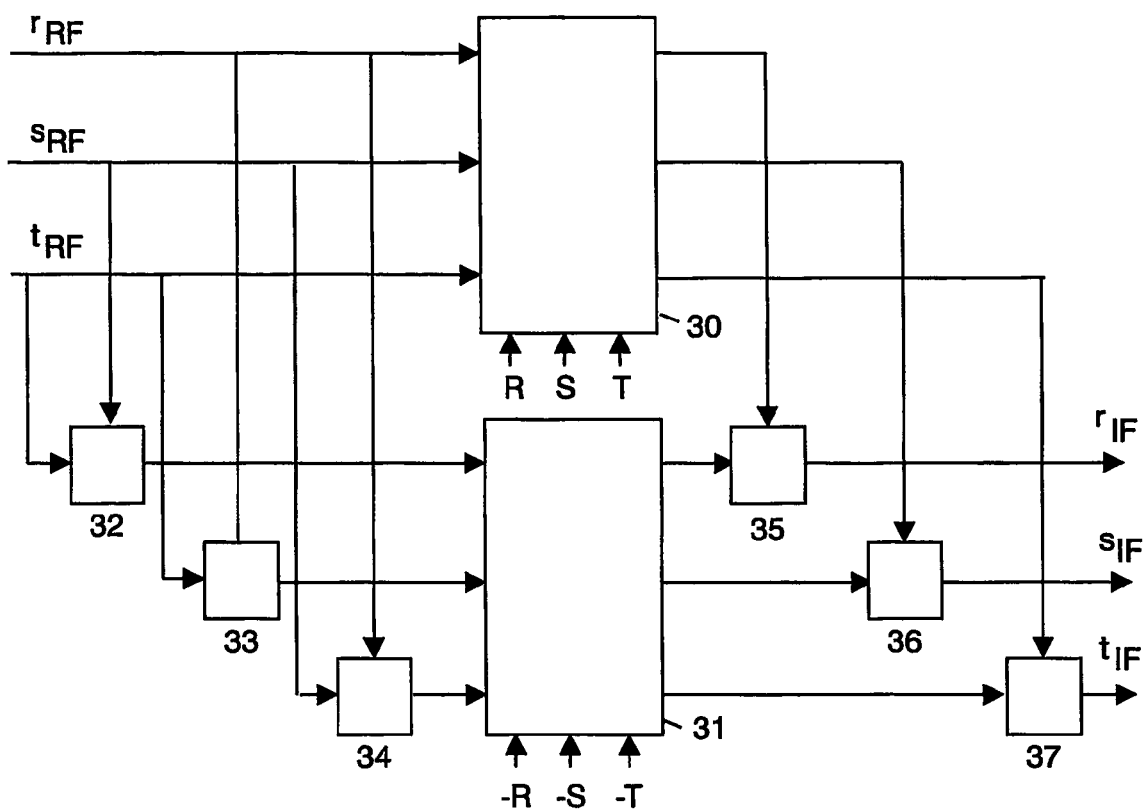

FIG. 1 illustrates a three-phase mixer-system for showing the three-phase mixing principle, FIG. 2 illustrates a three-phase mixer-system according to the invention comprising first balancing means, and FIG. 3 illustrates a three-phase mixer-system according to the invention comprising second balancing means.

The three-phase mixer-system shown in FIG. 1 comprises three mixers 50-52 receiving a first signal $r_{RF}$ and three mixers 53-55 receiving a first signal $s_{RF}$ and three mixers 56-58 receiving a first signal $t_{RF}$. Mixers 50,53,56 receive a second signal R, mixers 51,54,57 receive a second signal S and mixers 52,55,58 receive a second signal T. Three respective combiners 60/61/62 combine output signals of respective mixers 50,53,56 and 51,54,57 and 52,55,58 into respective output signals $r_{IF}$ and $s_{IF}$ and $t_{IF}$.

The three-phase mixer-system shown in FIG. 2 comprises at least three groups of mixers 1-4,5-8,9-12 for frequency translating signals by multiplying second signals R,S,T (like for example three-phase oscillation signals etc.) with first signals $r_{RF}, s_{RF}, t_{RF}$ (like for example three-phase radiofrequency signals etc.) and comprises balancing means 13-21 for balancing said three groups of mixers 1-4,5-8,9-12. Said first (second,third) group of mixers comprises a group of switching transistors 1-3 (5-7,9-11) and an amplifying transistor 4 (8,12) coupled to at least said group of switching transistors 1-3 (5-7,9-11). Balancing means 13-15 (16-18,19-21) comprise further switching transistors 13-15 (16-18,19-21) which are also coupled to amplifying transistor 4 (8,12).

Said at least one amplifying transistor 4 (8,12) receives at its control electrode a first signal $r_{RF}$ ($s_{RF}, t_{RF}$) and comprises a first main electrode coupled to a reference source like for example ground etc. and second main electrodes coupled to first main electrodes of switching transistors 1-3 (5-7,9-11) and of further switching transistors 13-15 (16-18,19-21). Thereto, either said at least one amplifying transistor 4 (8,12) comprises three second main electrodes each coupled to one of said switching transistors 1-3 (5-7,9-11) and to one of said further switching transistors 13-15 (16-18,19-21). Or, said at least one amplifying transistor 4 (8,12) comprises three amplifying transistors of which the control electrodes are coupled to each other and of which the first main electrodes are coupled to each other etc.

A second main electrode of switching transistor 1 (5,9) is coupled via a resistor 22 (23,24) to a voltage source and forms a first (second,third) output for generating an output signal $r_{IF}$ ($s_{IF}, t_{IF}$). A second main electrode of switching transistors 7+10 (2+11,3+6) is coupled to said first (second, third) output for generating the output signal $r_{IF}$ ($s_{IF}, t_{IF}$). Further switching transistors 13-15 (16-18,19-21) either each comprise two second main electrodes or each comprise two switching transistors of which the control electrodes are coupled to each other and of which the first main electrodes are coupled to each other etc. Both second main electrodes of switching transistor 13 (14,15) are coupled to said second and third (first and third, first and second) output. Both second main electrodes of switching transistor 16 (17,18) are coupled to said first and third (first and second, second and third) output. Both second main electrodes of switching transistor 19 (20,21) are coupled to said first and second (second and third, first and third) output.

For reasons of symmetry, switching transistors 1-3,5-7,9-11 preferably each comprise two parallel transistors (with parallel meaning that electrodes of the same kind are coupled to each other).

Switching transistors 1,5,9 receive at their control electrodes the R signal, switching transistors 2,6,10 receive at their control electrodes the S signal, switching transistors 3,7,11 receive at their control electrodes the T signal, further switching transistors 13,16,19 receive at their control electrodes the −R signal, further switching transistors 14,17,20 receive at their control electrodes the −S signal, and further switching transistors 15,18,21 receive at their control electrodes the −T signal. It should be noted that for sine wave signals (so before non-linearity/clipping) −R=S+T, that −S=R+T and that −T=R+S.

Said transistors may be bipolar transistors or FETs respectively, with a control electrode corresponding with a basis or a gate respectively, with a first main electrode corresponding with an emitter or a source respectively and with a second main electrode corresponding with a collector or a source respectively.

The signals R,S,T have a 120 degrees phase difference between each pair of them and for example each comprise the same oscillation frequency. The first signals $r_{RF}, s_{RF}, t_{RF}$ have a 120 degrees phase difference between each pair of them and each comprise for example the same carrier frequency. Dependently on phases and/or momentary voltages of the signals, sums of their (oscillation and carrier) frequencies and/or differences between their (oscillation and carrier) frequencies will appear at the outputs of the three-phase mixer-system. Amplifying transistors 4,8,12 will show a linear performance. Switching transistors 1-3,5-7,9-11 and further switching transistors 13-21 are switched on and off in dependence of the amplitude of the signals R,S,T and −R,−S,−T, with their main current being determined by said amplifying transistors 4,8,12.

By introducing said balancing means 13-21 for balancing said three groups of mixers 1-4,5-8,9-12, at least a part (being, inter alia, said groups of mixers) of said three-phase mixer-system is more balanced for mixing products with even harmonics of the oscillator signal, which will be suppressed. Compared to said prior art three-phase mixer-system in which the mixer transistors (said groups of switching transistors 1-3,5-7,9-11) create 33.3% duty cycles (due to only one of the set of 1-3 and of the set of 5-7 and of the set of 9-11 being conductive while the other two of each set are non-conductive), the mixer transistors in the three-phase mixer-system according to the invention (said groups of switching transistors 1-3,5-7,9-11 and said further switching transistors 13-21) together create duty cycles of 50% (due to having created pairs controlled by opposite signals) and are additionally balanced. Additional advantages of 50% duty cycles are a highest possible mixer efficiency and an improved noise figure.

The three-phase mixer-system shown in FIG. 3 comprises at least three groups of mixers 30 for frequency translating signals by multiplying second signals R,S,T (like for example three-phase oscillation signals etc.) with first signals $r_{RF}, s_{RF}, t_{RF}$ (like for example three-phase radiofrequency signals etc.) and comprises balancing means 31 for balancing said three groups of mixers 30. Thereto, said balancing means comprise three further groups of mixers 31.

Said groups of mixers 30 and said further groups of mixers 31 may each correspond with a prior art embodiment or with the embodiment shown in FIG. 2. Said groups of mixers 30 receive first signals $r_{RF}, s_{RF}, t_{RF}$ (at their first inputs) and receive second signals R,S,T (at their second inputs). Said groups of mixers 31 receive $s_{RF}+t_{RF}$ invertedly from an adder 32 and receive $r_{RF}+t_{RF}$ invertedly from an adder 33 and receive $r_{RF}+s_{RF}$ invertedly from an adder 34 (at their fourth inputs) and receive inverted second signals −R,−S,−T (at their third inputs). Respective outputs of groups of mixers 30 and respective outputs of further groups of mixers 31 are coupled to inputs of respective adders 35-37 which generate the output signals $r_{IF}, s_{IF}, t_{IF}$ at the outputs of the three-phase mixer-system. Alternatively, said groups of mixers 31 may receive first signals $r_{RF}, s_{RF}, t_{RF}$ (at their fifth inputs) and may receive inverted second signals −R,−S,−T (at their third inputs), with outputs of both groups of mixers being coupled via subtracters 35-37.

By introducing said balancing means 31 for balancing said groups of mixers 30, at least a part (being, inter alia, at least some of the signal paths in the three-phase mixer-system) of said three-phase mixer-system is more balanced. While using said first group of mixers 30 receiving three out of six (six-phase) second signals and using said further group of mixers 31 receiving the other three out of said six (six-phase) second signals, said even harmonics caused by said 33.3% duty cycles will be cancelled by said adding or subtracting of said output signals.

The apparatus according to the invention may be for example a telecommunication apparatus, like for example a mobile phone or a modem or a transceiver etc., or may be for example an audio receiver, like a radio etc., or an audio/video receiver, like for example a television etc., and comprises the three-phase mixer-system according to the invention and at least one polyphase filter coupled to inputs of said three-phase mixer-system (with these inputs receiving said second signals, said first signals, said inverted or opposite signals and/or said sums of pairs of first signals).

Such a three-phase mixer-system for example either performs an up-conversion of frequencies, in which case said apparatus for example forms part of a transmitter, or performs a down-conversion, in which case said apparatus for example forms part of a receiver. Therefore, in FIGS. 1, 2 and 3, said $r_{RF}, s_{RF}, t_{RF}$ and said $r_{IF}, s_{IF}, t_{IF}$ may trade places and may be replaced by other three-phase sub-signals etc. An input receiving an inverted signal of course corresponds with a further input receiving a non-inverted signal with an inverter being located between said further input and said input etc.

The expression "for" in for example "for translating" and "for balancing" and "for controlling" etc. does not exclude that other functions are performed as well, simultaneously or not. The expressions "X coupled to Y" and "a coupling between X and Y" and "coupling/couples X and Y" etc. do not exclude that an element Z is in between X and Y. The expressions "P comprises Q" and "P comprising Q" etc. do not exclude that an element R is comprises/included as well. The terms "a" and "an" do not exclude the possible presence of one or more pluralities.

The invention is based upon an insight, inter alia, that unbalance will cause mixing products with harmonics of the oscillator signal, and is based upon a basic idea, inter alia, that said unbalance can be reduced or even avoided by introducing balancing means.

The invention solves the problem, inter alia, of providing a three-phase mixer-system requiring less polyphase filtering and/or bandpass filtering, and is advantageous, inter alia, in that less complex and/or less expensive and/or less power consuming filters are needed, with the three-phase mixer-system being low cost and still having low power consumption and requiring little and/or less chip surface.

The invention claimed is:

1. Three-phase mixer-system comprising at least three groups of mixers (1-4, 5-8, 9-12, 30) for frequency translating signals, wherein said three-phase mixer-system comprises balancing means (13-21, 31) for balancing at least a part of said three-phase mixer-system wherein said at least three groups of mixers (1-4, 5-8, 9-12, 30) comprise at least three first inputs for receiving first signals and at least three second inputs for receiving second signals, with said balancing means (13-21, 31) comprising at least three third inputs for receiving inverted first or second signals.

2. Three-phase mixer-system according to claim 1, wherein each group of mixers (1-4, 5-8, 9-12) comprises at least one amplifying transistor (4, 8, 12) coupled to at least a group of switching transistors (1-3, 5-7, 9-11), with said balancing means (13-21) comprising per group of mixers (1-4, 5-8, 9-12) and per at least one switching transistor of said group of switching transistors (1-3, 5-7, 9-11) at least one further switching transistor (13-15, 16-18, 19-21), with said group of switching transistors (1-3, 5-7, 9-11) being controlled via said second signals (R,S,T) and with said further switching transistors (13-15, 16-18, 19-21) being controlled via inverted second signals (−R, −S, −T).

3. Three-phase mixer-system according to claim 2, wherein per group of mixers (1-4, 5-8, 9-12) said at least one amplifying transistor (4, 8, 12) is controlled via a first signal ($r_{rf}$, $s_{rf}$, $t_{rf}$) and comprises a first main electrode coupled to a reference source and a second main electrode coupled to first main electrodes of each switching transistor of said group of switching transistors (1-3, 5-7, 9-11) and of said further switching transistors (13-15, 16-18, 19-21), with a second main electrode of said at least one switching transistor of said group of transistors (1-3, 5-7, 9-11) being coupled to an output of said three-phase mixer-system and with a second main electrode of said at least one further switching transistor (13-15, 16-18, 19-21) being coupled to at least one other input.

4. Three-phase mixer-system according to claim 1, wherein said balancing means (31) comprise a further group of mixers (31).

5. Three-phase mixer-system according to claim 4, wherein said balancing means (31) either comprise at least three fourth signals, with each fourth signal being a combination of a pair of first signals ($r_{rf}$, $s_{rf}$, $t_{rf}$), or comprise at least three fifth inputs for receiving said first signals ($r_{rf}$, $s_{rf}$, $t_{rf}$), and with said third inputs receiving inverted second signal (−R, −S, −T).

6. Three-phase mixer-system according to claim 5, wherein outputs of said groups of mixers (30) and of said further groups of mixers (31) are coupled for generating combinations of output signals.

7. Apparatus comprising a three-phase mixer-system comprising at least three groups of mixers (1-4, 5-8, 9-12, 30) for frequency translating signals, wherein said three-phase mixer-system comprises balancing means (13-21, 31) for balancing at least a part of said three-phase mixer-system, with said apparatus comprising at least one polyphase filter coupled to first or second inputs of said three-phase mixer-system wherein said at least three groups of mixers (1-4, 5-8, 9-12, 30) comprise at least three first inputs for receiving first signals and at least three second inputs for receiving second signals, with said balancing means (13-21, 31) comprising at least three third inputs for receiving inverted first or second signals.

8. Apparatus according to claim 7, wherein said apparatus comprises at least one further filter coupled to outputs of said three-phase mixer-system.

* * * * *